United States Patent
Wano et al.

(10) Patent No.: US 8,969,776 B2
(45) Date of Patent: *Mar. 3, 2015

(54) SOLID-STATE IMAGING DEVICE, METHOD OF MANUFACTURING THE SAME, AND ELECTRONIC APPARATUS HAVING AN ON-CHIP MICRO LENS WITH RECTANGULAR SHAPED CONVEX PORTIONS

(71) Applicant: Sony Corporation, Tokyo (JP)

(72) Inventors: Hiromi Wano, Kanagawa (JP); Atsushi Toda, Kanagawa (JP); Yoichi Otsuka, Kanagawa (JP); Atsushi Yamamoto, Kumamoto (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/964,962

(22) Filed: Aug. 12, 2013

(65) Prior Publication Data

US 2013/0327927 A1 Dec. 12, 2013

Related U.S. Application Data

(63) Continuation of application No. 12/728,464, filed on Mar. 22, 2010, now Pat. No. 8,530,814.

(30) Foreign Application Priority Data

Mar. 31, 2009 (JP) .................................. 2009-088097

(51) Int. Cl.
*H01L 27/00* (2006.01)
*H01L 31/0232* (2014.01)
*H01L 27/146* (2006.01)
*H04N 5/225* (2006.01)
*H04N 5/3728* (2011.01)
*H04N 9/04* (2006.01)
*H01L 27/148* (2006.01)

(52) U.S. Cl.
CPC .... *H01L 27/14627* (2013.01); *H01L 27/14685* (2013.01); *H04N 5/2257* (2013.01); *H04N 5/3728* (2013.01); *H04N 9/045* (2013.01); *H01L 27/14843* (2013.01)
USPC ........................................ 250/208.1; 257/432

(58) Field of Classification Search
CPC .................... H01L 27/14627; H01L 27/14625
USPC .......... 250/208.1, 216; 348/340; 257/294, 432
See application file for complete search history.

(56) References Cited

U.S. PATENT DOCUMENTS

| | | | | |
|---|---|---|---|---|
| 7,443,005 B2* | 10/2008 | Kuo et al. | | 257/432 |
| 7,768,088 B2* | 8/2010 | Fukunaga | | 257/436 |
| 7,791,011 B2* | 9/2010 | Rennie | | 250/208.1 |
| 8,530,814 B2* | 9/2013 | Wano et al. | | 250/208.1 |
| 2009/0261440 A1* | 10/2009 | Kawasaki | | 257/432 |

FOREIGN PATENT DOCUMENTS

WO WO2007/132583 * 11/2007

* cited by examiner

*Primary Examiner* — Thanh Luu
(74) *Attorney, Agent, or Firm* — Sheridan Ross P.C.

(57) ABSTRACT

A solid-state imaging device includes a light sensing portion which is formed on a substrate and generates a signal electric charge according to incident light; a rectangular or gradient-index on-chip micro lens formed on a light incident side above the light sensing portion; and a planarized lens layer which covers the on-chip micro lens and is formed in such a manner that a light incident surface is planarized.

15 Claims, 14 Drawing Sheets

SAMPLE A: RELATED ART
SAMPLE B: COMPARISON EXAMPLE 1
SAMPLE C: COMPARISON EXAMPLE 2
SAMPLE D: PRESENT EMBODIMENT EXAMPLE

SAMPLE A: RELATED ART
SAMPLE B: COMPARISON EXAMPLE 1
SAMPLE C: COMPARISON EXAMPLE 2
SAMPLE D: PRESENT EMBODIMENT EXAMPLE

SAMPLE A: RELATED ART
SAMPLE B: COMPARISON EXAMPLE 1
SAMPLE C: COMPARISON EXAMPLE 2
SAMPLE D: PRESENT EMBODIMENT EXAMPLE

SOLID-STATE IMAGING DEVICE, METHOD OF MANUFACTURING THE SAME, AND ELECTRONIC APPARATUS HAVING AN ON-CHIP MICRO LENS WITH RECTANGULAR SHAPED CONVEX PORTIONS

CROSS REFERENCES TO RELATED APPLICATIONS

This application is a continuation of U.S. patent application Ser. No. 12/728,464 filed Mar. 22, 2010, which claims the benefit of Japanese Patent Application No. 2009-088097 filed on Mar. 31, 2009, the entire contents of each of which are hereby incorporated by reference.

BACKGROUND OF THE INVENTION

1. Field of the Invention

The present invention relates to a solid-state imaging device, method of manufacturing the same, and an electronic apparatus using the solid-state imaging device.

2. Description of the Related Art

In related art, as a solid-state imaging device used in a digital camera or a video camera, a CCD solid-state imaging device or CMOS solid-state imaging device are known. In these solid-state imaging devices, a light sensing portion is formed at each of a plurality of pixels which are formed in a two dimensional matrix shape, and signal electric charges are generated according to an amount of light received in the light sensing portion. In addition, the signal electric charges generated in the light sensing portion are transmitted and amplified, whereby an image signal is obtained.

In recent years, in the solid-state imaging device, in order to improve light collecting efficiency for light incident on the light sensing portion which has been reduced in size in response to a reduction in the size of the pixels, a spherical shaped on-chip micro lens or a gradient index lens is formed on a light incident side of the pixels (see, Japanese Unexamined Patent Application Publication Nos. 2004-304148 and 2008-10773). As a result, the light collecting efficiency for the light incident on the light sensing portion is improved, and sensitivity is improved.

A sectional configuration of a CCD solid-state imaging device using an on-chip micro lens in related art is illustrated in FIGS. 20A and 20B. As shown in FIG. 20A, the solid-state imaging device 100 of related art includes a substrate 101 on which the light sensing portion 102 is formed, a wiring layer 115 formed on the substrate 101, a color filter layer 109 formed on the wiring layer 115, and an on-chip micro lens 110.

The substrate 101 is constituted by a silicon substrate. The light sensing portion 102 is constituted by a photo diode, and a plurality of the light sensing portions in the form of a matrix is formed on a desired region of the substrate 101. In addition, a transmission channel portion 103 is formed through a read channel portion 105 on a region adjacent to the light sensing portion 102 on the substrate 101, and a transmission electrode 107 is formed on the wiring layer 115 which is on the read channel portion 105 and the transmission channel portion 103. The transmission electrode 107 is formed on a gate insulating film 106 formed on the substrate 101 above the read channel portion 105 and the transmission channel portion 103. Further, while not shown, in addition to the transmission electrode 107, desired wiring is formed through an insulating interlayer on the wiring layer 115.

In addition, one pixel is constituted by a region including the light sensing portion 102, the read channel portion 105 which is formed adjacent to the light sensing portion 102, and the transmission channel portion 103. The one pixel is separated from the adjacent pixel by a separation region 104. Further, the on-chip micro lens 110 is formed in the spherical shape, and the spherical on-chip micro lens 110 is used as a light collecting element.

In this configuration, incident light is collected by the spherical on-chip micro lens 110 and is incident on the light sensing portion 102. Signal electric charges are generated and accumulated according to incident light by photoelectric conversion in the light sensing portion 102. In addition, the signal electric charges accumulated in the light sensing portion 102 are read in the transmission channel portion 103 through the read channel portion 105 by applying a voltage to the transmission electrode 107 and transmitted in a vertical direction.

In this solid-state imaging device 100 in related art, the interface between air and the on-chip micro lens 110 has the second-highest refraction index of incident light, while the interface reflection of a substrate 101 including silicon has the highest refraction index. In cases where a periodic configuration such as the on-chip micro lens 110 is formed on the interface having a high reflectivity, when incident light $L_1$ including parallel light beams is incident on the on-chip micro lens surface, as shown in FIG. 20B, light beams reflected on the on-chip micro lens surface of each pixel interfere with each other. Accordingly, a reflected diffraction light $L_2$ is constituted by the interference of the reflected light.

As shown in FIG. 20B, when an outside element 116 such as a cover glass or a multilayer infrared cut filter is formed above the on-chip micro lens 110, the reflected diffraction light $L_2$ is reflected by the outside element 116. In addition, a diffraction light $L_3$ caused by the reflected diffraction light $L_2$ further reflected by the outside element 116 is incident on the light sensing portion 102 again. The diffraction light $L_3$ which enters in this manner is a cause of a ghost or flare. FIG. 21 schematically illustrates an image obtained when a subject having a high luminance is photographed with a solid-state imaging device 100 of the related art. As shown in FIG. 21, when a subject 121 having a high luminance is photographed, a ghost image 122 is photographed around the subject having a high luminance by the diffraction light $L_3$ caused by the periodic configuration due to the on-chip micro lens 110 as described above.

In Japanese Unexamined Patent Application Publication No. 2008-66669, in order to suppress a ghost image, there is disclosed a technique in which the on-chip micro lens is formed with such a thickness as a ghost image hardly appears. However, as long as the interface between the air and the on-chip micro lens has a periodic configuration, it is difficult to dramatically suppress the occurrence of a flare or ghost.

SUMMARY OF THE INVENTION

In view of the above, it is desirable to provide a solid-state imaging device in which the occurrence of a flare or ghost is suppressed, and a method of manufacturing the same. Further, it is desirable to provide an electronic apparatus using the solid-state imaging device.

A solid-state imaging device according to an embodiment of the invention includes a light sensing portion, an on-chip micro lens, and a planarized lens layer. The light sensing portion is formed on a substrate and generates a signal electric charge in response to incident light. Further, the on-chip micro lens is a rectangular-shaped lens or gradient index lens which is formed on a light incident side of the light sensing portion. The planarized lens layer is a lens which is formed to cover the on-chip micro lens so that the light incident surface is planarized.

Since the planarized lens layer is formed on the on-chip micro lens in the solid-state imaging device of this embodiment, periodic configuration is not formed on an interface with the air. For this reason, the occurrence of the reflected diffraction light is suppressed.

A method of manufacturing a solid-state imaging device according to another embodiment of the invention includes the steps of forming on a substrate a light sensing portion which generates a signal electric charge according to incident light, and forming a rectangular-shaped or gradient-index on-chip micro lens on a light incident side of the light sensing portion. The method further includes the step of covering the on-chip micro lens so as to form a planarized lens layer such that the surface onto which light is incident is planarized.

A method of manufacturing a solid-state imaging device according to further embodiment of the invention includes the steps of forming on a substrate a light sensing portion which generates a signal electric charge according to incident light, and forming a rectangular-shaped on-chip micro lens on a light incident side of the light sensing portion. The method further includes the steps of forming a first planarized lens layer so as to cover the on-chip micro lens and removing the first planarized lens layer until an upper surface of the on-chip micro lens is exposed. In addition, the method further includes the step of forming a second planarized lens layer on an upper face of the on-chip micro lens and on the upper face of the first planarized lens layer which is buried to a height of the upper face of the on-chip micro lens.

An electronic apparatus according to further another embodiment of the invention includes an optical lens, a solid-state imaging device into which light collected in the optical lens is incident, and a signal processing circuit for processing an output signal which is output from the solid-state imaging device.

The solid-state imaging device used in the embodiments of the invention includes a light sensing portion, an on-chip micro lens, and a planarized lens layer. The light sensing portion is formed on a substrate and generates a signal electric charge according to incident light. The on-chip micro lens is a rectangular-shaped lens or gradient index lens which is formed on a light incident side of the light sensing portion. The planarized lens layer is a lens which covers the on-chip micro lens and is formed in such a manner that the light incident surface is planarized.

According to the embodiment of the present invention, a solid-state imaging device can be obtained in which the occurrence of a flare or ghost is suppressed. Further, an electronic apparatus achieving improved picture image quality can be obtained.

DESCRIPTION OF THE PREFERRED EMBODIMENTS

Figure 1:
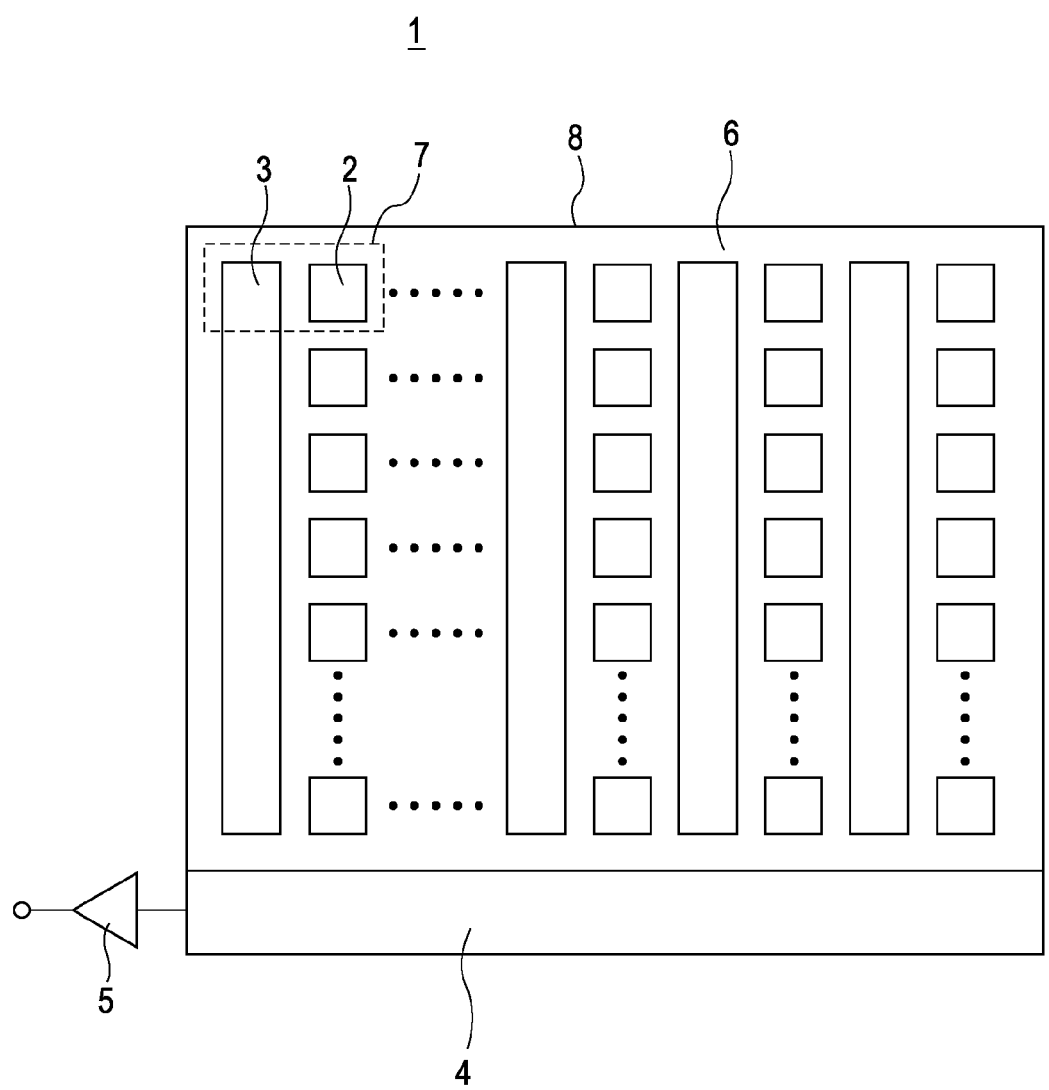
FIG. 1 is a schematic diagram of a CCD solid-state imaging device 1 according to a first embodiment of the invention.

Hereinafter, examples of a solid-state imaging device, a method of manufacturing the same, and an electronic apparatus according to embodiments of the present invention will be described with reference to FIGS. 1 to 19. Embodiments of the invention will be described in the following order. In addition, the invention is not intended to be limited to the following examples.
1. First Embodiment: Example of Solid-state Imaging Device
  1.1 Schematic Configuration of the Whole Solid-state Imaging Device 1.2 Sectional Configuration of the Solid-state Imaging Device
1.3 Method of manufacturing the Solid-state Imaging Device
1.4 Properties of the Solid-state Imaging Device
2. Second Embodiment: Example of Solid-state Imaging Device
2.1 Sectional Configuration of the Solid-state Imaging Device
2.2 Method of manufacturing the Solid-state Imaging Device
3. Third Embodiment: Example of Solid-state Imaging Device
4. Fourth Embodiment: Example of Solid-state Imaging Device
5. Fifth Embodiment: Electronic Apparatus 1. First Embodiment Example of Solid-State Imaging Device A solid-state imaging device according to a first embodiment of the invention will be described with reference to FIGS. 1 to 13. The solid-state imaging device illustrated in this embodiment is an example of a CCD (Charge Coupled Devices) solid-state imaging device.
1.1 Schematic Configuration of the Whole Solid-State Imaging Device FIG. 1 is a schematic diagram of a CCD solid-state imaging device 1 according to a first embodiment of the invention. As shown in FIG. 1, the solid-state imaging device 1 of this embodiment has a plurality of light sensing portions 2 formed on a substrate 6, a vertical transmission resistor 3, a horizontal transmission resistor 4, and an output circuit 5. In addition, a unit pixel 7 is constituted by one light sensing portion 2 and the vertical transmission resistor 3 which is adjacent to the light sensing portion 2. Further, a region on which a plurality of the pixels 7 is formed is a pixel portion 8.

The light sensing portion 2 is constituted by photodiode, and a plurality of the light sensing portions 2 are formed in the form of a matrix in horizontal and vertical directions of the substrate 6. A signal electric charge is generated and accumulated in the light sensing portion 2 in response to incident light by a photoelectric conversion.

The vertical transmission resistor 3 has a CCD structure, and a plurality of the vertical transmission resistors 3 are formed vertically at every light sensing portion 2 which is arranged vertically. The vertical transmission resistor 3 reads signal electric charges in the light sensing portion 2 and transmits vertically the accumulated signal electric charge. A transmission stage in which the vertical transmission resistor 3 of the embodiment of invention is formed has, for example, a four phase driven structure by a transmission pulse which is applied from a transmission drive pulse circuit (not shown). Further, at a final stage of the vertical transmission resistor 3, a signal electric charge retained at the final stage by an application of a transmission pulse is transmitted to the horizontal transmission resistor 4.

The horizontal transmission resistor 4 has a CCD structure and is formed at one end of the final stage of the vertical transmission resistor 3. The transmission stage in which the horizontal transmission resistor 4 is formed transmits horizontally the signal electric charge, which is transmitted vertically by the vertical transmission resistor 3, for every one horizontal line.

An output circuit 5 is formed at the final stage of the horizontal transmission resistor 4. In the output circuit 5, a signal electric charge, which is transmitted horizontally by the horizontal transmission resistor 4, is output as video signal by a conversion of the electric charge into a voltage.

Figure 2:
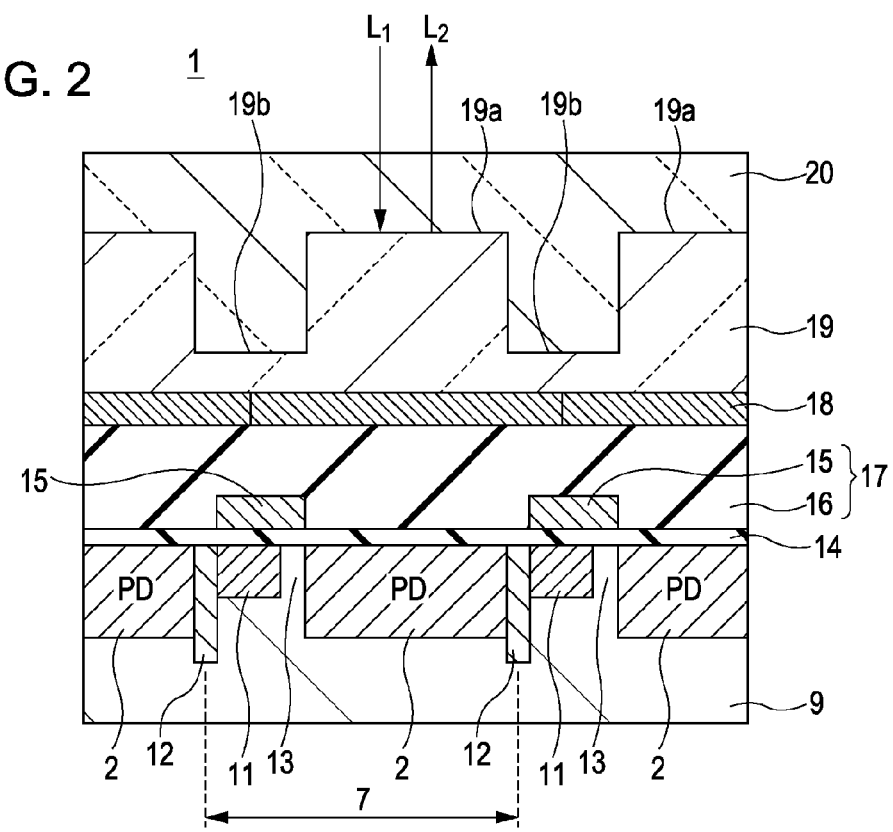
FIG. 2 is a sectional view of horizontally adjacent pixels in the solid-state imaging device of the first embodiment.

With the solid-state imaging device 1 having the above configuration, signal electric charges which were generated and accumulated by the light sensing portion 2 are transmitted vertically by the vertical transmission resistor 3 and are transmitted into the horizontal transmission resistor 4. In addition, the signal electric charges which were transmitted into the horizontal transmission resistor 4 are each transmitted horizontally, and are output as video signal by using the output circuit 5.
1.2 Sectional Configuration of the Solid-State Imaging Device Next, a sectional configuration of a pixel portion 8 of the solid-state imaging device 1 of this embodiment will be described. FIG. 2 is a schematic sectional view of the horizontally adjacent pixels 7 of the solid-state imaging device 1 of this embodiment.

As shown in FIG. 2, the solid-state imaging device 1 of this embodiment includes a substrate 9, a wiring layer 17, a color filter layer 18, an on-chip micro lens 19, and a planarized lens layer 20.

The substrate 9 is configured by a semiconductor substrate including silicon. A light sensing portion 2 including photodiode is formed in a desired region on a light incident side of the substrate 9. In this light sensing portion 2, a signal electric charge is generated and accumulated by a photoelectric conversion of incident light. Further, in a region which is adjacent to the light sensing portion 2, a transmission channel portion 11 which constitutes the vertical transmission resistor 3 having the CCD structure shown in FIG. 1 is formed, and a region between the transmission channel portion 11 and the light sensing portion 2 is a read channel portion 13. The signal electric charge which is generated and accumulated by the light sensing portion 2 is read by transmission channel portion 11 through the read channel portion 13 and is transmitted into the transmission channel portion 11. In addition, in a region surrounding one light sensing portion 2 and the transmission channel portion 11 which is adjacent to the light sensing portion 2, a separation region 12 is formed. A region surrounded by the separation region 12 constitutes 1 pixel.

The wiring layer 17 includes a transmission electrode 15 which is formed through a gate insulating film 14 over the transmission channel portion 11 of the substrate 9 and the read channel portion 13, and an insulating interlayer 16 covering the transmission electrode 15. In FIG. 2, only the transmission electrode 15 in a wiring layer 17 is illustrated, however other desired films such as the wiring film for providing the transmission electrode 15 with a drive pulse and a metal light-shielding film or the like can be formed in the wiring layer 17.

A color filter layer 18 is formed for each pixel in such a manner that each of the R (red), G (green), and B (blue) color filter layer 18 formed on the planarized wiring layer 17 is in, for example, a Bayer configuration.

An on-chip micro lens 19 is formed on the color filter layer 18, has a convex part 19a of which a section is a rectangular shape over the light sensing portion 2 formed on the substrate 9 and has a concave part 19b between the adjacent pixels 7. Further, a surface of the light incident side of such a rectangular on-chip micro lens 19 is formed horizontally to an incident direction of parallel light. As a construction material of the on-chip micro lens 19, an organic resin such as styrene, acryl or the like, or an inorganic material such as P—SiO$_2$, P—SiN or the like can be used.

The planarized lens layer 20 is formed so as to bury and cover the rectangular on-chip micro lens 19, and an upper face of the planarized lens layer 20 is formed in a planarized manner. Namely, the planarized lens layer 20 is installed so as to uniformly flatten the entire light incident surface of the pixel portion 8 shown in FIG. 1. As a construction material of the planarized lens layer 20, fluorine containing resin, or an inorganic material such as P—SiO$_2$, P—SiN or the like can be used. Further, the planarized lens layer 20 is formed so that its refraction index is lower than that of the lower layer on-chip micro lens 19, and its refraction index is between the refraction index of air and the refraction index of the on-chip micro lens 19.

Here, a collection principle of light by the rectangular on-chip micro lens 19 will be described with reference to FIGS. 3A and 3B.

Figure 3A:
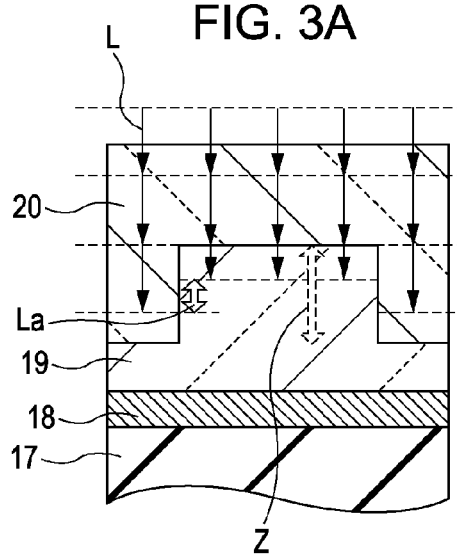
FIGS. 3A and 3B are diagrams illustrating a travelling direction of light beams incident on an on-chip micro lens when the on-chip micro lens of a rectangular shape is used.
Figure 3B:
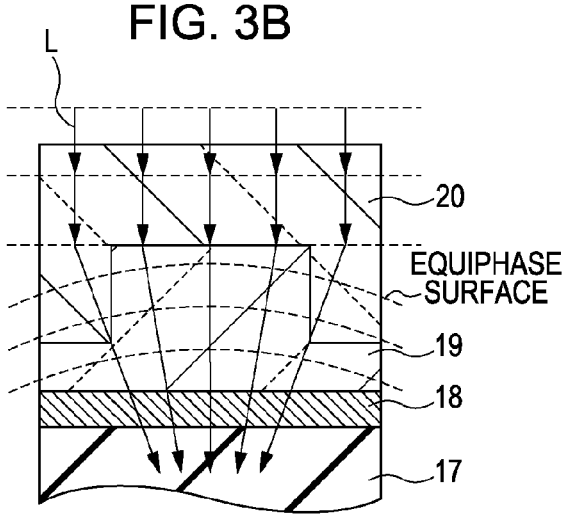

FIGS. 3A and 3B illustrate a traveling direction of light incident the on-chip micro lens 19 when an on-chip micro lens 19 having a rectangular shape is used. As shown in FIG. 3A, since the refraction index of the rectangular on-chip micro lens 19 is larger than that of the planarized lens layer 20, the speed of light (phase speed) incident the on-chip micro lens 19 is delayed more than the speed of light advanced into the planarized lens layer 20, and a phase difference La occurs. Thereupon, since there is a phase difference of light at a boundary between a convex part and a concave part of the on-chip micro lens 19, an equiphase surface is bent as shown in FIG. 3B, as a result, incident light travels while being collected in a direction of the convex part of the on-chip micro lens 19. Namely, in this embodiment, by using the rectangular on-chip micro lens 19, incident light is collected where incident light is bent, but is collected using a phase difference of light.

Further, in the on-chip micro lens 19, it is possible to design the on-chip micro lens 19 so that it has a desired light-collecting force by adjusting height Z of the convex part having a rectangular shape.

In this manner, in the solid-state imaging device 1 of this embodiment, the incident light is collected by being incident on the light sensing portion 2 using the rectangular on-chip micro lens 19. Further, since in the solid-state imaging device 1 of this embodiment, by using the planarized lens layer 20 formed on the entire light incident surface of the pixel portion 8, the boundary with the air is planarized so that reflected diffraction light caused by a periodic configuration is decreased. The occurrence of ghost or flare is hereby reduced.

In addition, in the solid-state imaging device 1 of this embodiment, even when there is a small difference in refraction indexes between the on-chip micro lens 19 and the planarized lens layer 20, the light-collecting force can be increased by increasing the height Z of the on-chip micro lens 19.

1.3 Method of Manufacturing Solid-State Imaging Device

Next, a method of manufacturing the solid-state imaging device 1 of this embodiment will be described. FIGS. 4A to 6 are process diagrams illustrating the method of manufacturing the solid-state imaging device 1 of this embodiment. In this embodiment, since processes up to the process of forming the color filter layer 18 are identical to those typically performed in the method of manufacturing the solid-state imaging device, description thereof will be omitted and the description will be made from the processes after the formation of the color filter layer 18.

Figure 4A:
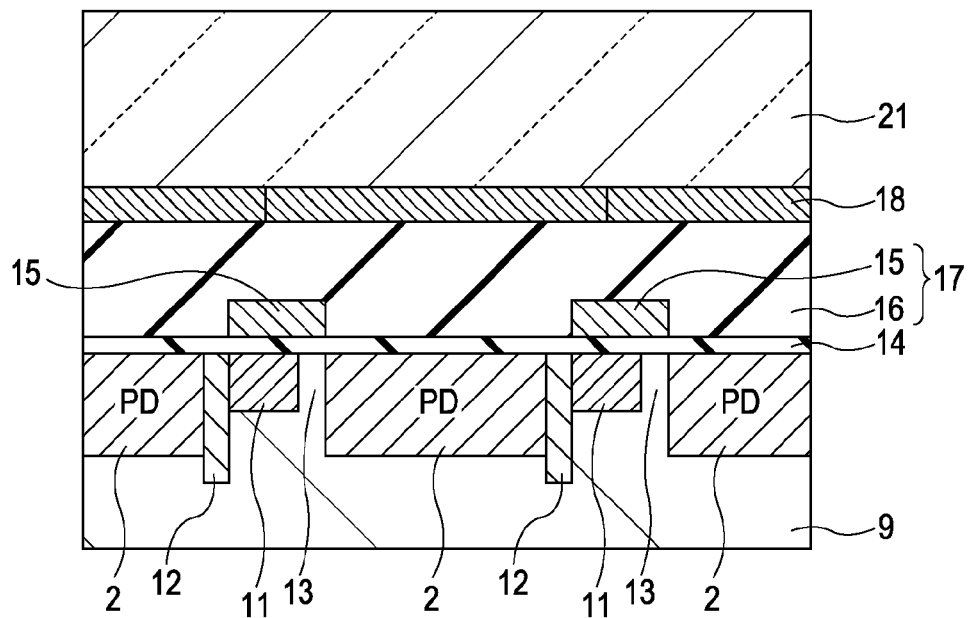
FIGS. 4A and 4B are process diagrams (part 1) illustrating a method of manufacturing the solid-state imaging device of the first embodiment.

As shown in FIG. 4A, after the color filter layer 18 is formed, an on-chip micro lens base material 21, which includes an organic resin such as styrene, acryl or the like, or an inorganic material such as P—SiO$_2$, P—SiN or the like, is applied onto the color filter layer 18.

Figure 4B:
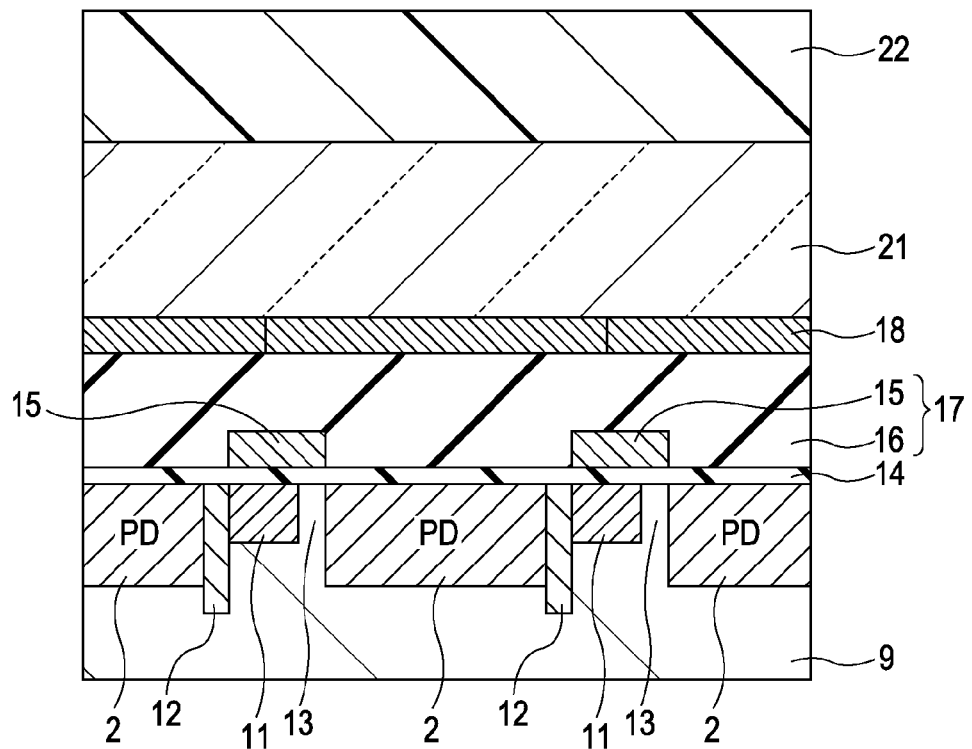

Next, as shown in FIG. 4B, a thick film resist layer 22 is applied over the on-chip micro lens base material 21.

Figure 5A:
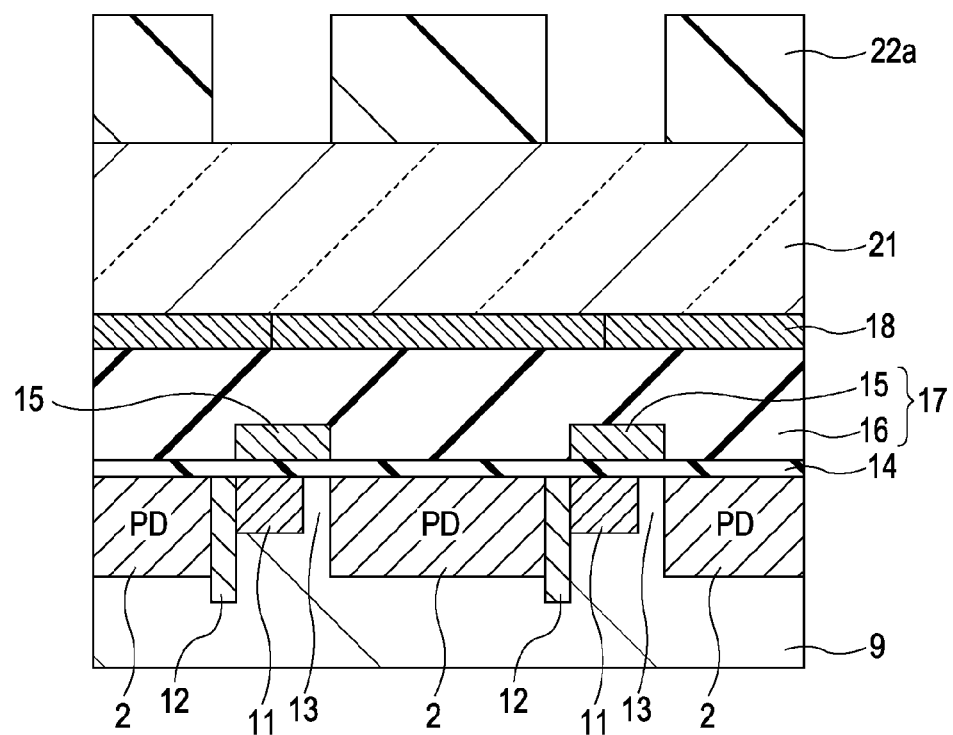
FIGS. 5A and 5B are process diagrams (part 2) illustrating the method of manufacturing the solid-state imaging device of the first embodiment.

Next, by exposing and developing the thick film resist layer 22 by a photolithograph method, a patterning is performed as shown in FIG. 5A, thereby forming a resist mask 22a. In this embodiment, the patterning is performed so that the thick film resist layer 22 is removed between the adjacent pixels, as shown in FIG. 5A.

Figure 5B:
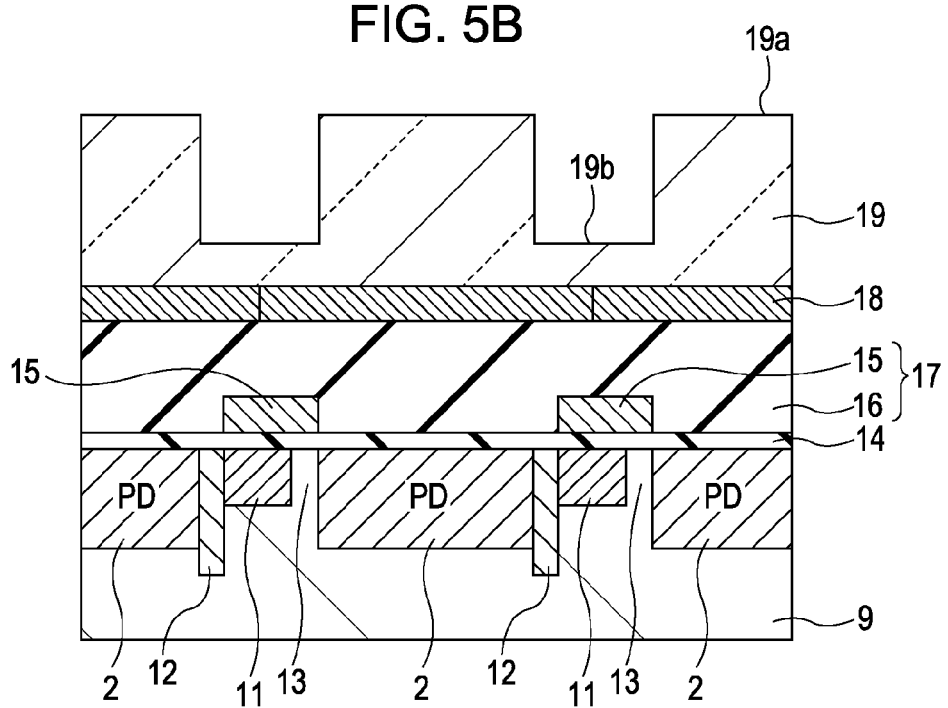

Next, by the pattern-formed resist mask 22a, the on-chip micro lens base material 21 is dry etched, and after finishing the dry etching, the resist mask 22a is removed. As a result, as shown in FIG. 5B, the formation of the on-chip micro lens 19 formed in a rectangular shape, which has a convex part 19a on the light sensing portion 2 formed on the substrate 9 and has a concave part 19b between the adjacent pixels, is completed.

Figure 6:
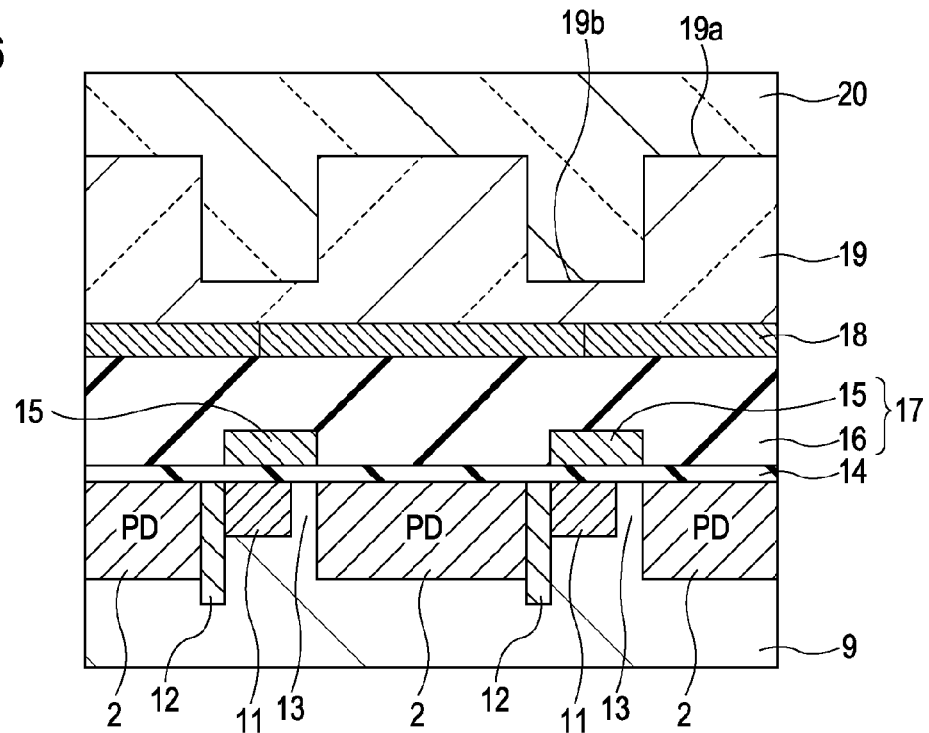
FIG. 6 is a process diagram (part 3) illustrating the method of manufacturing the solid-state imaging device of the first embodiment.

Next, as shown in FIG. 6, the planarized lens layer 20 is formed all over the on-chip micro lens 19 so as to bury and cover the on-chip micro lens 19. A planarized material including fluorine containing resin, P—SiO$_2$ or P—SiN is piled up by a CVD method or is applied using a spin coat method, thereby forming a planarized lens layer 20 having a planarized surface. With the above process, the solid-state imaging device 1 of this embodiment is formed.

1.4 Properties of Solid-State Imaging Device

Next, the solid-state imaging devices of comparison examples 1 and 2 are illustrated, and the properties of the solid-state imaging device 1 of this embodiment are described.

Figure 7:
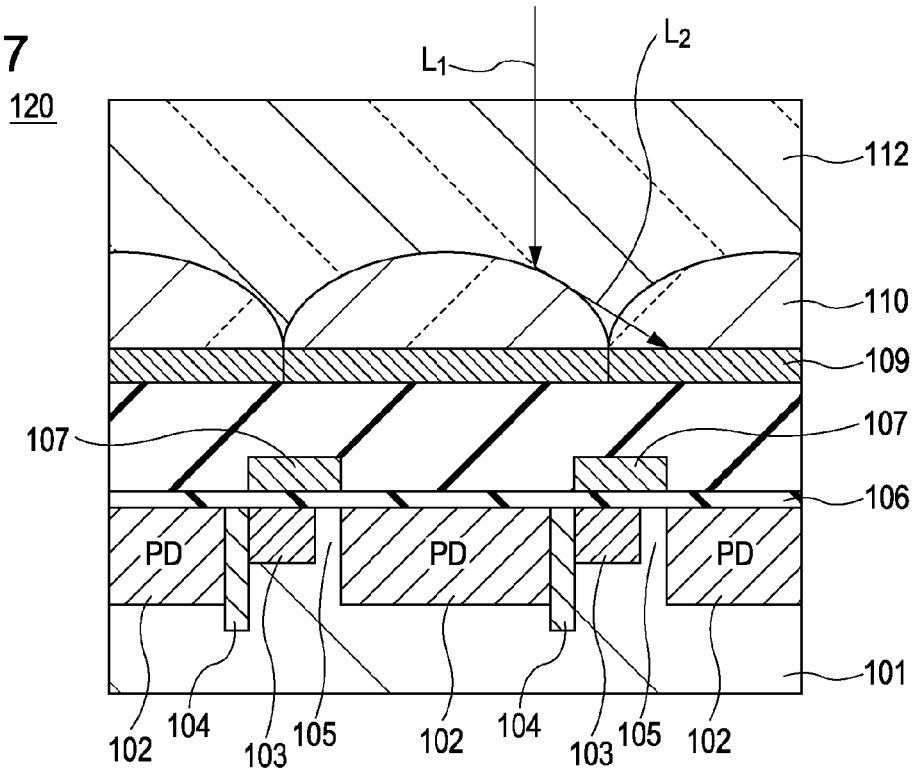
FIG. 7 is a sectional view of a solid-state imaging device according to comparison example 1.
Figure 8:
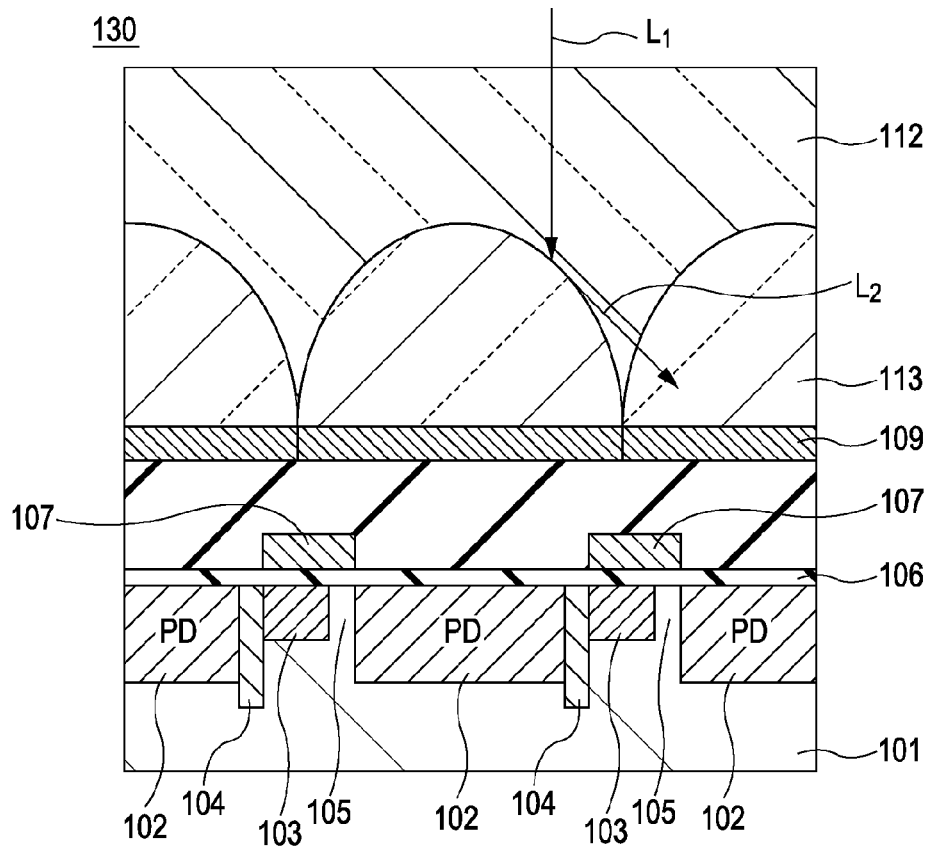
FIG. 8 is a sectional view of a solid-state imaging device according to comparison example 2.

FIG. 7 is a sectional view of a solid-state imaging device 120 according to comparison example 1, and FIG. 8 is a sectional view of a solid-state imaging device 130 according to comparison example 2. The solid-state imaging devices 120 and 130 in FIGS. 7 and 8 are the examples which use the spherical on-chip micro lenses, the sections in FIGS. 7 and 8 corresponding to those in FIG. 20A are denoted by identical numbers, and overlapping description will be omitted.

Figure 20A:
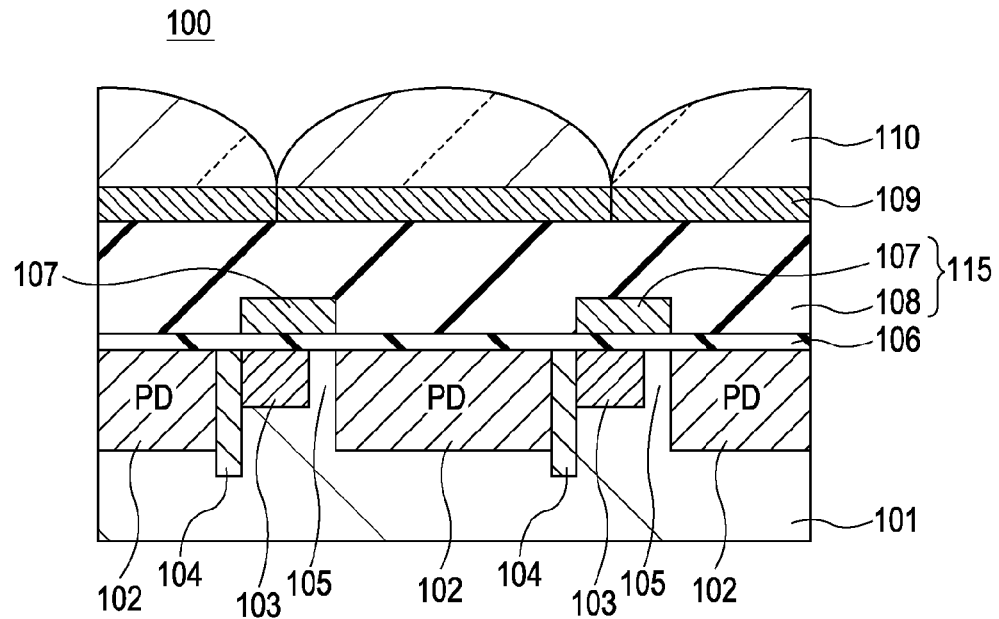
FIGS. 20A and 20B are sectional views of solid-state imaging devices according to a related art.
Figure 20B:
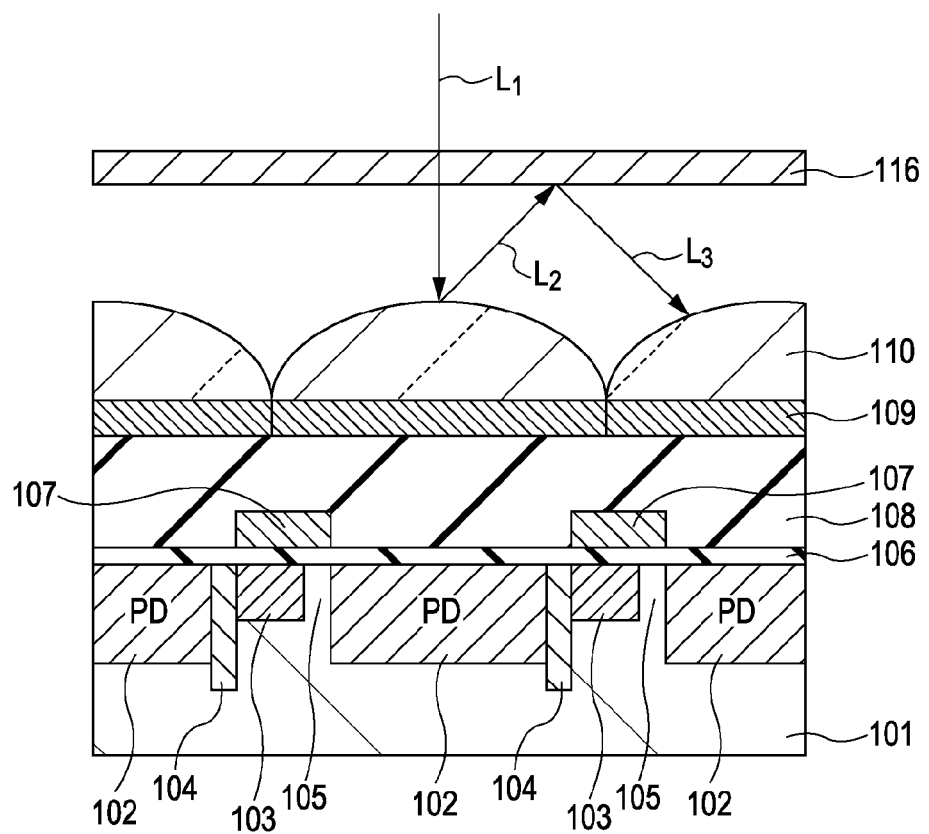
Figure 21:
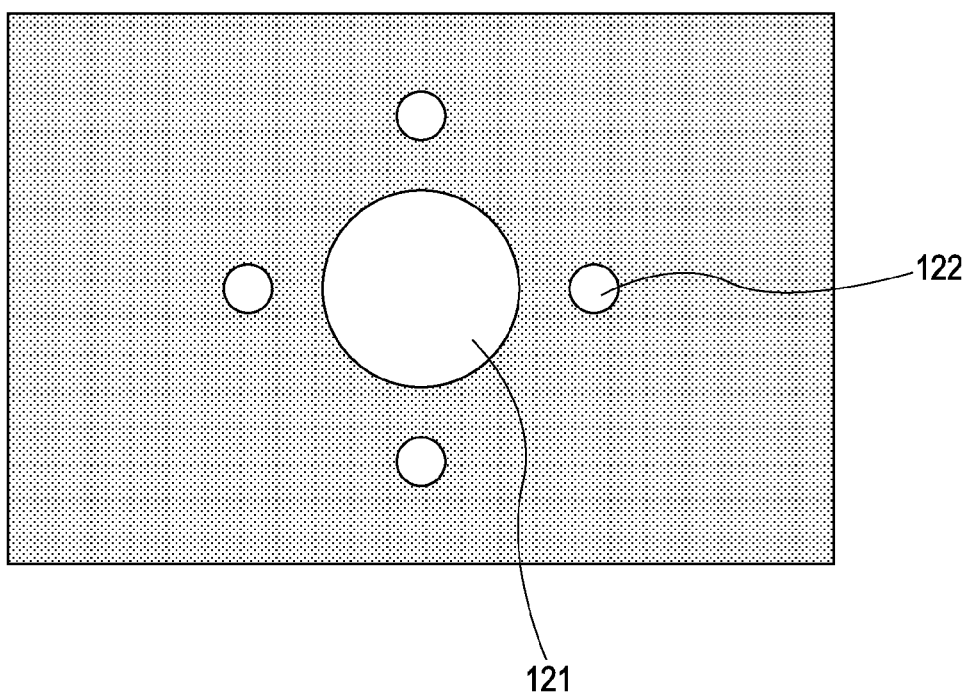
FIG. 21 is a schematic diagram illustrating image obtained when a subject having a high luminance is photographed with a solid-state imaging device of related art.

The solid-state imaging device 120 of comparison example 1 shown in FIG. 7 is an example in which a planarized lens layer 112 is formed on the upper face of the on-chip micro lens 110 in a solid-state imaging device 100 of the related art shown in FIG. 20A. In the solid-state imaging device 120 in the comparison example 1, periodic configuration is not formed at an interface between air having low refraction index (refraction index=1) and a lens material having a refraction index higher than that of air, by constituting the planarized lens layer 112, as compared with the solid-state imaging device 100 of related art shown in FIG. 20A. As a result, the occurrence of flare or ghost which causes the problem in the solid-state imaging device 100 of related art is suppressed.

However, as in the comparison example 1, in the configuration in which the planarized lens layer 112 is formed on the spherical on-chip micro lens 110 without any change, the difference in refraction indexes between the on-chip micro lens 110 and the planarized lens layer 112 is small. When the spherical on-chip micro lens 110 is used, since the light collection is performed by refracting the incident light, if the difference in the refraction index is small, the light-collecting force is decreased, whereby the sensitivity is deteriorated.

Thus, ideally, as shown in comparison example 2 of FIG. 8, the radius of the curvature of the on-chip micro lens 113 is made to be small, so that even when the planarized lens layer 112 is formed on the spherical on-chip micro lens 113, the sensitivity can be improved.

However, since the spherical on-chip micro lens as shown in FIGS. 7 and 8 is formed typically by a reflow of the positive resist by a reflow method, it is difficult to form in a manner that the on-chip micro lens has a curvature which is equal to or grater than a hemisphere.

Further, as shown in FIGS. 7 and 8, incident light L1 incident on the spherical on-chip micro lens surface is reflected from an interface of the on-chip micro lens, and the reflected light L2 is incident on the adjacent pixel. In particular, since an interface angle is large in the on-chip micro lens 113 with a high curvature, in the comparison example 2, as compared with the comparison example 1, reflectivity of the light is increased in the interface of a large angle. Thereupon, in the solid-state imaging device 130 as shown in FIG. 8, the light to be incident on the adjacent pixel is increased and a spectrum property deteriorates. In this manner, the light incident on the adjacent pixel by the interface reflection becomes a cause of a color mixing. Since the color mixing property is a noise, even a slight amount may cause the property deterioration.

Thus, in the solid-state imaging devices 120 and 130 in the comparison examples 1 and 2, although the occurrence of ghost can be suppressed, since the sensitivity and the color mixing property deteriorates, it is not practical, and the solid-state imaging device 130 of the comparison example 2 is difficult to realize in terms of manufacturing.

In the solid-state imaging device 1 of this embodiment, since the on-chip micro lens 19 has rectangular shape as shown in FIG. 2, the incident light L1 incident the on-chip micro lens 19 is reflected from the interface and the reflected light L2 advances vertically to the interface. For this reason, the reflected light does not enter the adjacent pixel. The color mixing is hereby reduced.

Further, in the solid-state imaging device 1 of this embodiment, as described with reference to FIGS. 6A and 6B, the light collection property of the on-chip micro lens 19 can be improved by adjusting the height Z of the rectangular convex part. For this reason, it is possible to obtain the same light-collecting force as the comparison example 2 by adjusting the height Z. The sensitivity can be hereby improved.

With reference to FIGS. 9 to 13, there are illustrated the simulation results of the properties of the solid-state imaging device 100 of related art shown in FIG. 20A, the solid-state imaging device 120 of the comparison example 1 shown in FIG. 7, the solid-state imaging device 130 of the comparison example 2 shown in FIG. 8, and the solid-state imaging device 1 of this embodiment shown in FIG. 2. In FIGS. 9 to 13, the solid-state imaging device 100 of related art is indicated by sample A, the solid-state imaging device 120 of the comparison example 1 is indicated by sample B, the solid-state imaging device 130 of the comparison example 2 is indicated by sample C, and the solid-state imaging device 1 of this embodiment is indicated by sample D.

Figure 9:
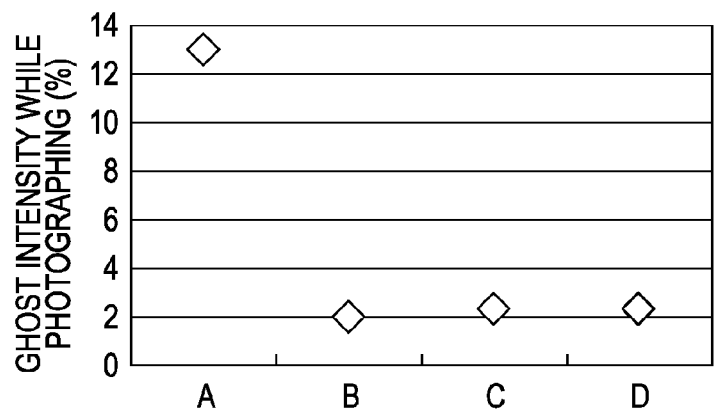
FIG. 9 is a simulation result of an intensity of ghost generated while photographing when each solid-state imaging device is built in a camera set.

FIG. 9 is a simulation result of ghost intensity generated while photographing, when each solid-state imaging device is built in a camera set, and it is a measurement of luminance signal ratio of the pixel of ghost portion in regard to a sensitivity of a high luminance subject image capturing pixel. Ghost intensity is measured by measuring the intensity of first diffraction light.

As shown in FIG. 9, as compared with the sample A in which the planarized lens layer is not formed, in the samples B, C, and D in which the planarized lens layers are formed, an output of the sensitivity signal of ghost portion is decreased up to ¹⁄₁₀ or less. As a result, an effect in which the occurrence of ghost is suppressed by the planarized lens layer is acknowledged.

Figure 10:
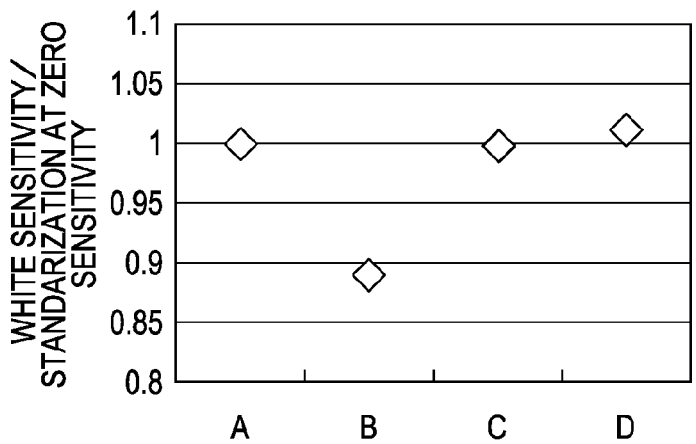
FIG. 10 illustrates a result that is measured by simulation of white sensitivity, which is standardized by a measurement result in sample A (a solid-state imaging device of the related art)

FIG. 10 is a measurement result of white sensitivity by a simulation, and shows the standardization by the measurement results in sample A (solid-state imaging device in related art). As can be seen from FIG. 10, since in the sample B, the difference in refraction indexes between the on-chip micro lens and the planarized lens layer is small and a spherical shaped curvature of the on-chip micro lens is small, refractive power of light is not obtained, the light collection property deteriorates, and the sensitivity is low. As compared with this, the sensitivity is improved in sample C in which the spherical shape of the on-chip micro lens has ideal curvature and sample D in which on-chip micro lens has a rectangular shape. In addition, in the sample D, the sensitivity which is equal to or larger than the sample A or sample C is obtained.

Figure 11:
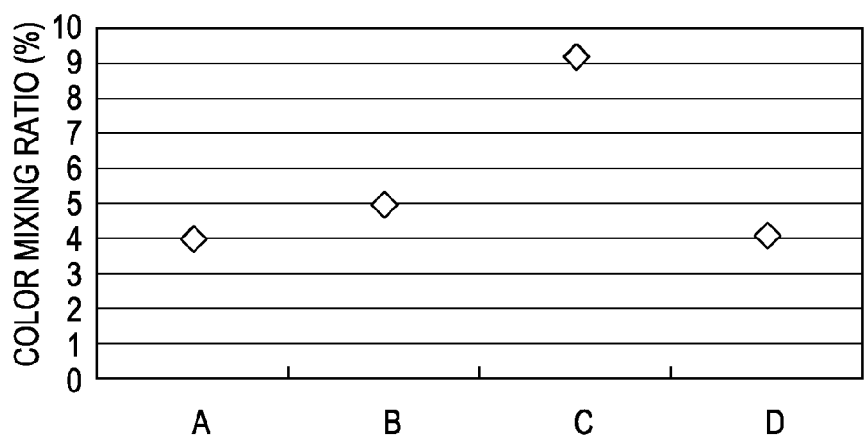
FIG. 11 illustrates a result of mixing color ratio (a certain memory: indicated by an arbitrary unit) that is measured by simulation.

FIG. 11 is the measurement results of the color mixing ratio (a certain memory: indicated by an arbitrary unit) by simulation. As can be seen from FIG. 11, the color mixing ratio of the sample C is the highest, and in the sample D, the color mixing ratio is suppressed to the color mixing ratios smaller than the samples A and B.

Figure 12:
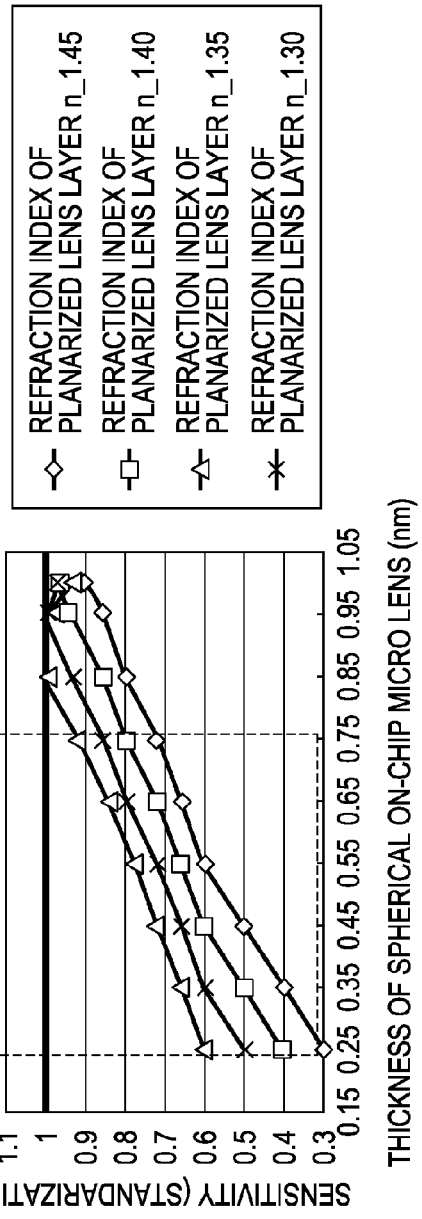
FIG. 12 is a diagram illustrating changes in sensitivity corresponding to changes in the thickness of a spherical on-chip micro lens and a refraction index of a planarized lens layer in solid-state imaging devices of comparison examples 1 and 2.

FIG. 12 illustrates, changes in the sensitivity corresponding to changes in the thickness of the spherical on-chip micro lens 110 (113) and the refraction index of the planarized lens layer 112, in the solid-state imaging devices 120 and 130 of the comparison examples 1 and 2. The thickness in this case is the thickness of the thickest part in a section of the on-chip micro lens.

Figure 13:
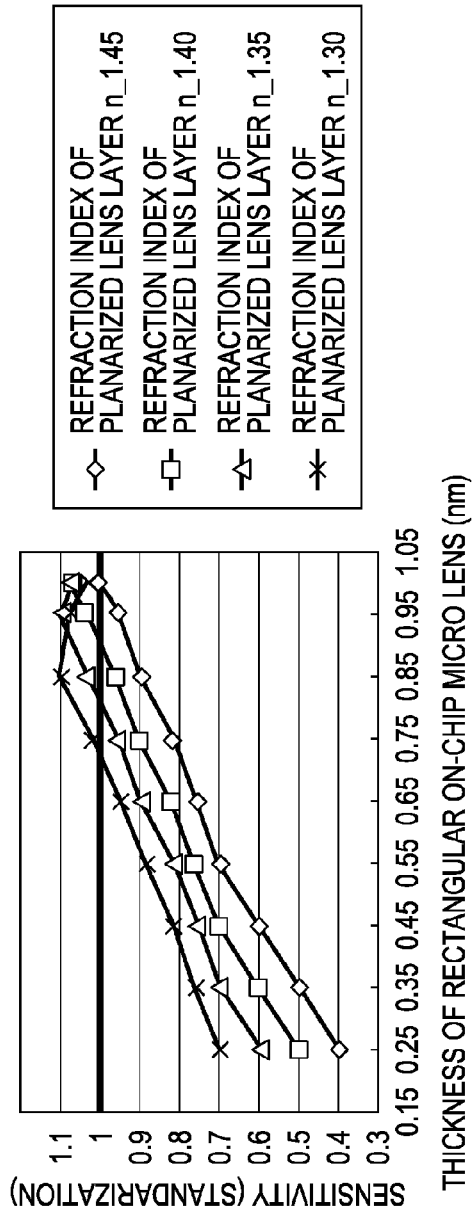
FIG. 13 is a diagram illustrating changes in sensitivity corresponding to changes in the height of a rectangular on-chip micro lens and a refraction index of a planarized lens layer in the solid-state imaging device of the first embodiment.

Further, FIG. 13 illustrates changes in the sensitivity corresponding to changes in the height of the rectangular on-chip micro lens 19 (corresponding to the height Z shown in FIG. 6A) and the refraction index of the planarized lens layer 20, in the solid-state imaging device 1 of this embodiment. Both FIGS. 12 and 13 illustrate the property standardized by the sensitivities which are measured by the solid-state imaging device 100 of the related art, and these drawings show simulation results by pixel cells of 1.75 μm pitch.

As can be seen from FIGS. 12 and 13, the sensitivity is improved by increasing the thickness (height) of each on-chip micro lens, and sensitivity which is equal to or larger than the solid-state imaging device 100 of the related art is obtained.

However, as described above, since the spherical on-chip micro lens 110 (113) is formed by a reflow method, the thickness (proportion to the curvature) which can be formed is limited, and practically, only the formation within the range surrounded by the dot lines of FIG. 12 can be performed. Namely, the thickness of the spherical on-chip micro lens in the range of about 0.85 nm to 0.95 nm corresponds to the solid-state imaging device 130 illustrated in comparison example 2, although the sensitivity within this range is obtained favorably, in practice, the manufacturing thereof is difficult. For this reason, if it is desired to obtain high sensitivity, the refraction index of the planarized lens layer 112 should be reduced, and therefore materials that can be selected as the material of the planarized lens layer 112 are limited.

In this connection, in the solid-state imaging device 1 of this embodiment, there is no restrictions on the height of the rectangular on-chip micro lens 19 that can be manufactured. For this reason, by forming the on-chip micro lens 19 to be high, the range of the selected refraction index of the planarized lens layer 20 to have a suitable sensitivity is extended.

In this manner, regarding the sensitivity, from the viewpoint of the method of manufacturing, the solid-state imaging device 1 of this embodiment is superior to the solid-state imaging device 100 of related art, the solid-state imaging device 120 of the comparison example 1, and the solid-state imaging device 130 of the comparison example 2.

From the above simulation results, in the configuration in which the planarized lens layer is placed on the spherical on-chip micro lens (comparison examples 1 and 2), although the occurrence of ghost can be suppressed, a deterioration of the sensitivity or an occurrence of the color mixing is unavoidable. In this connection, in the solid-state imaging device 1 of this embodiment, the occurrence of ghost is suppressed, and an improvement in the sensitivity or a decrease in the color mixing ratio is promoted, thereby improving an image quality. Further, in the solid-state imaging device 1 of this embodiment, since the on-chip micro lens 19 has a rectangular shape, a design change is easy as compared with the spherical on-chip micro lens, and it is possible to readily obtain a capability such as necessary light-collecting force or the like.

Further, while an example in which an on-chip micro lens 19 having a rectangular section is used is illustrated in the solid-state imaging device 1 of this embodiment, two layers of the lenses having the rectangular-shaped sections and different sizes may overlap to configure the on-chip micro lens. In that case, the rectangular lens having a section with a larger area constitutes the lower layer, and the rectangular lens having a section with a smaller area than that of the lower layer constitutes the upper layer.

2. Second Embodiment

Solid-State Imaging Device

Figure 14:
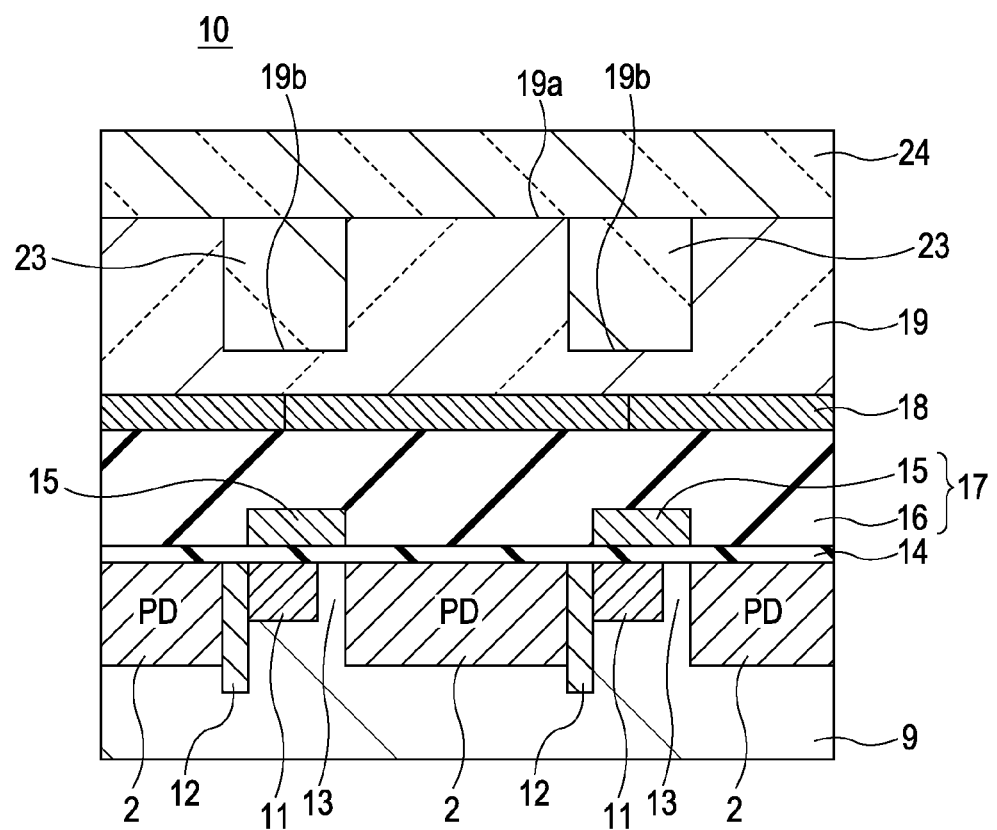
FIG. 14 is a sectional view of horizontally adjacent pixels in a solid-state imaging device according to a second embodiment of the invention.

Next, the solid-state imaging device according to the second embodiment of the invention will be described. FIG. 14 is a sectional view of a pixel portion 8 of a solid-state imaging device 10 of this embodiment. The overall configuration of the solid-state imaging device 10 of this embodiment is identical to FIG. 1, therefore the illustration thereof will be omitted. Further, in FIG. 10, the portions corresponding to those in FIG. 2 are denoted by identical numbers and the overlapping description will be omitted.

2.1 Configuration of Solid-State Imaging Device

In the solid-state imaging device 10 of this embodiment, two layered planarized lens layers including a first planarized lens layer 23 and a second planarized lens layer 24 are constituted on the rectangular on-chip micro lens 19.

The first planarized lens layer 23 is buried in the concave part 19b of the on-chip micro lens 19, and an upper face of the first planarized lens layer 23 is formed to be coplanar with an upper face of the convex part 19a of the on-chip micro lens 19.

The second planarized lens layer 24 covers the upper face of the convex part 19a of the on-chip micro lens 19 and the first planarized lens layer 23, and an upper portion which becomes a light incident surface is formed in a planarized manner.

The first planarized lens layer 23 and the second planarized lens layer 24 are constituted by an fluorine containing resin, or an inorganic material such as P—SiO$_2$, P—SiN or the like, and the refraction index n$_2$ of the second planarized lens layer 24 is higher than the refraction index n$_1$ of the first planarized lens layer 23. Also, the refraction indexes of the first planarized lens layer 23 and the second planarized lens layer 24 are made to be smaller than the refraction index n$_o$ of the on-chip micro lens.

Namely, the relationship of the refraction index n$_0$ of the on-chip micro lens 19, the refraction index n$_1$ of the first planarized lens layer 23, and the refraction index n$_2$ of the second planarized lens layer 24 becomes n$_0$>n$_2$>n$_1$.

In the solid-state imaging device 10 of the embodiment, the refraction index n$_1$ of the first planarized lens layer 23 is made to be smaller than the refraction index n$_2$ of the second planarized lens layer 24, thereby likely resulting in the occurrence of the phase difference contributing to the refraction of the incident light. In this manner, the light-collecting force of the light sensing portion 2 with respect to the incident light is increased and the sensitivity is improved.

2.2 Method of Manufacturing the Solid-State Imaging Device

Figure 15A:
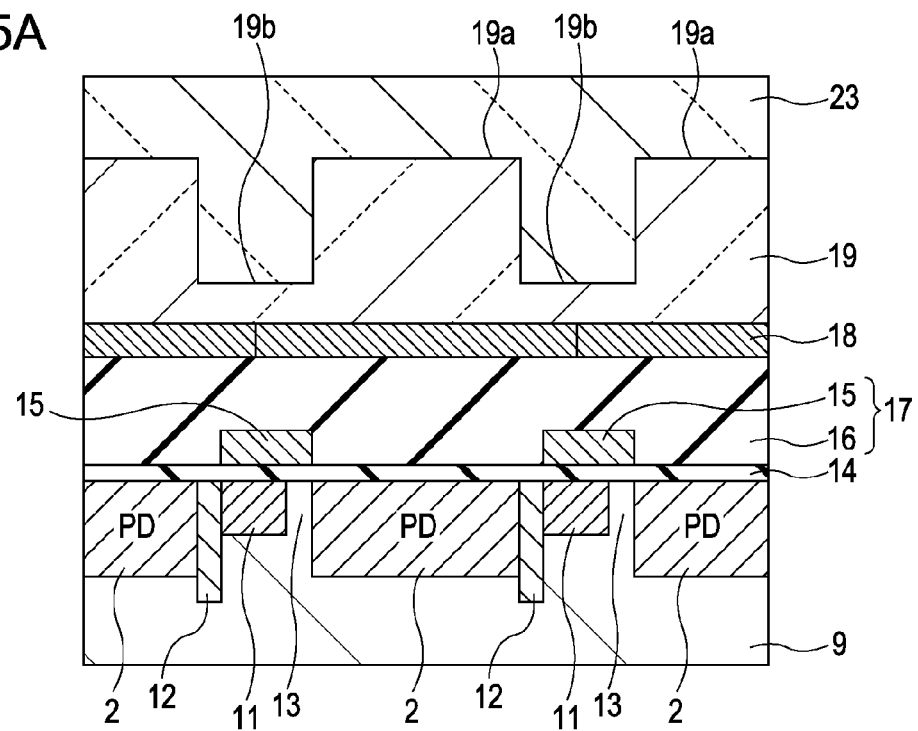
FIGS. 15A and 15B are process diagrams (part 1) illustrating a method of manufacturing the solid-state imaging device of the second embodiment.

Next, the method of manufacturing the solid-state imaging device 10 of this embodiment will be described. FIG. 15A to FIG. 16 are the process diagrams illustrating the method of manufacturing the solid-state imaging device 10 of this embodiment. In the method of manufacturing the solid-state imaging device 10 of this embodiment, the processes up to the formation process of the on-chip micro lens 19 are identical to the processes described with the reference to FIGS. 3A to 4D in the first embodiment, therefore FIGS. 3A to 4D are quoted and the description thereof will be omitted.

As shown in FIG. 15A, after the on-chip micro lens 19 is formed, the first planarized lens layer 23 is formed over the entire upper face of the on-chip micro lens 19 so as to bury the on-chip micro lens. The first planarized lens layer 23 is formed by piling up the planarized materials, which include the fluorine containing resin, P—SiO$_2$ or P—SiN, by the CVD method, or by applying the planarized materials using a spin coat method. Here, since the material constituting the first planarized lens layer 23 is buried in the concave part of the rectangular on-chip micro lens 19, it is desirable that the material be constituted by material having a good burying property.

Figure 15B:
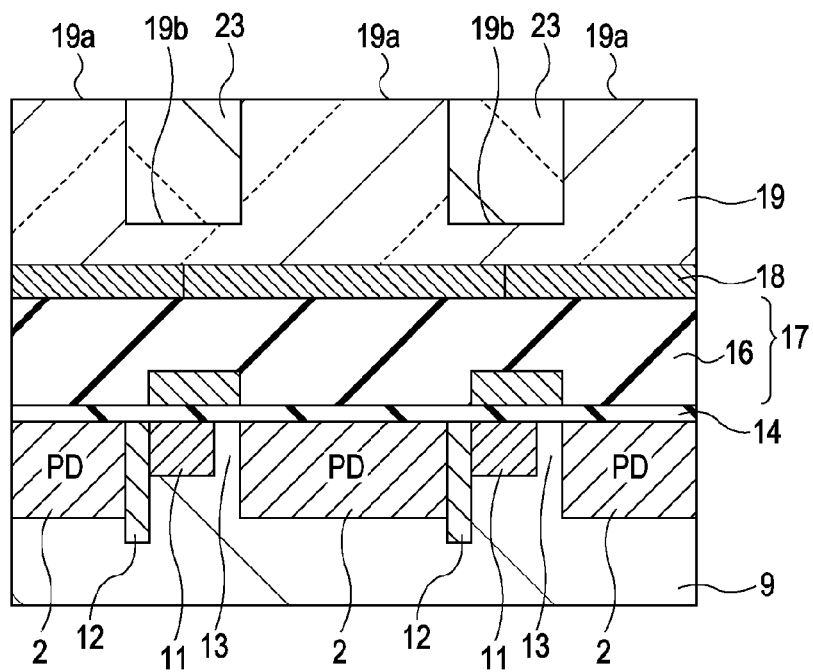
Figure 16:
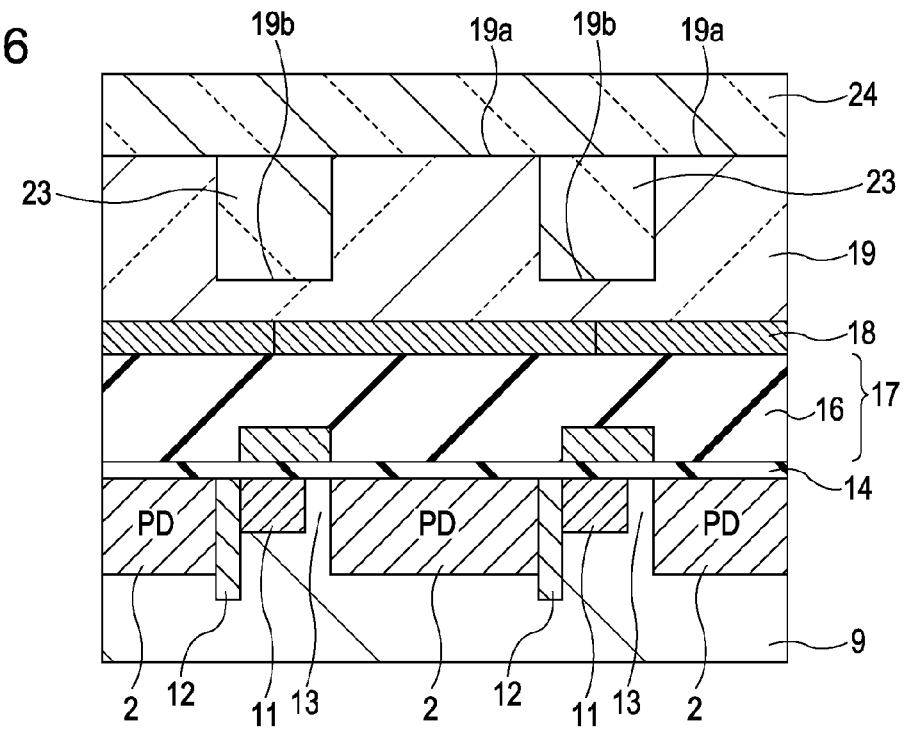
FIG. 16 is a process diagram (part 2) illustrating the method of manufacturing the solid-state imaging device of the second embodiment.

Next, as shown in FIG. 15B, after the first planarized lens layer 23 is formed, the first planarized lens layer 23 is removed by an etch back, until the upper face of the first planarized lens layer 23 is coplanar with the upper face of the convex part 19a of the rectangular on-chip micro lens 19. In this embodiment, since the on-chip micro lens 19 has the rectangular shape, an etch rate during the etch back steeply changes. For this reason, it is possible to use the upper face of the convex part 19a of the on-chip micro lens 19 as the etch stop.

Thereafter, as shown in FIG. 16, the second planarized lens layer 24 is formed on the on-chip micro lens 19 and the first planarized lens layer 23. The second planarized lens layer 24 is formed by piling up the planarized materials, which include the fluorine containing resin, the inorganic material, such as P—SiO$_2$ or P—SiN, by the CVD method, or by applying the planarized materials using the spin coat method. Since the second planarized lens layer 24 is formed in such a manner that its surface is planarized, it is desirable that the second planarized lens layer 24 be constituted by the materials having a high coating flattening property.

With the above-described processes, the solid-state imaging device 10 of this embodiment is formed.

In this manner, in the solid-state imaging device 10 of this embodiment, since the on-chip micro lens 19 has the rectangular shape, the first planarized lens layer 23 is removed up to the upper face of the convex part 19a of the on-chip micro lens 19 by the etch back, and then the second planarized lens layer 24 can be formed. For this reason, it is possible to change the materials of the first planarized lens layer 23 buried in the concave part 19b of the on-chip micro lens 19 and the second planarized lens layer 24 formed on the convex part 19a of the on-chip micro lens 19. This configuration is difficult to be realized in the solid-state imaging devices of the comparison examples 1 and 2 that use the spherical on-chip micro lenses.

In the solid-state imaging device 10 of the embodiment, since the planarized lens layer burying the on-chip micro lens 19 is constituted by the two layers of the first planarized lens layer 23 and the second planarized lens layer 24, whereby the phase difference of the incident light can be made large, it is possible to improve the light-collecting force. An improvement in the sensitivity is hereby promoted.

In addition, it is possible to obtain the same effects as the first embodiment.

3. Third Embodiment

Solid-State Imaging Device

Figure 17:
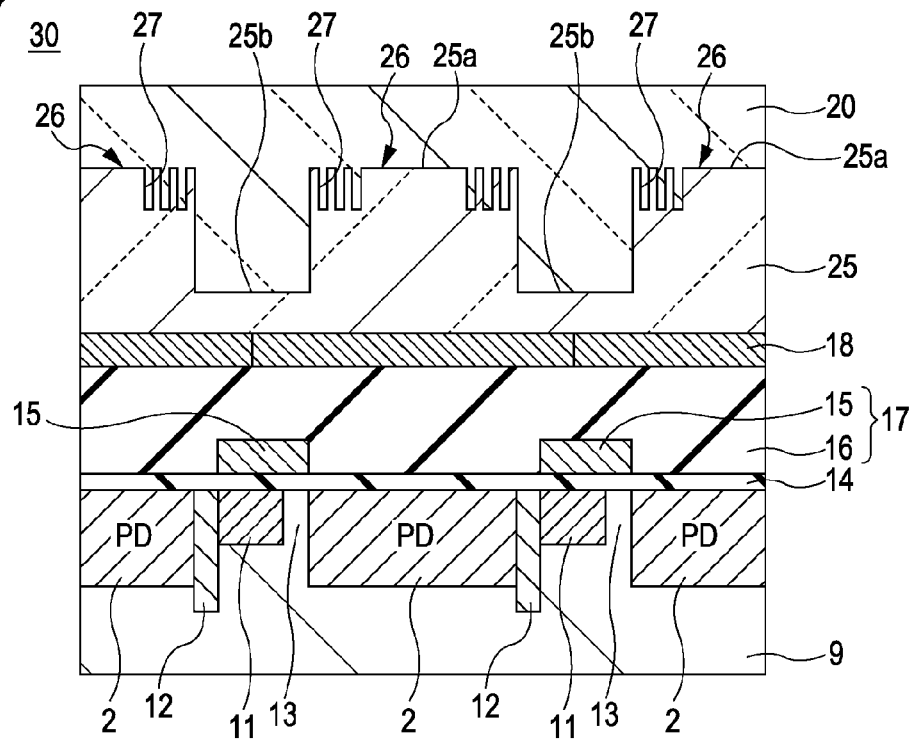
FIG. 17 is a sectional view of horizontally adjacent pixels in a solid-state imaging device according to a third embodiment of the invention.

Next, the solid-state imaging device according to the third embodiment of the invention will be described. FIG. 17 is a sectional view of the horizontally adjacent pixels of the solid-state imaging device 30 of this embodiment. The overall configuration of the solid-state imaging device 30 of the embodiment is identical to those in FIG. 1, therefore the illustration thereof will be omitted. Further, the parts in FIG. 17 corresponding to those in FIG. 2 are denoted by the same numbers and the overlapping description will be omitted.

As shown in FIG. 17, an on-chip micro lens 25 in the solid-state imaging device 30 of the embodiment is constituted by an optical element for sub-micrometer wavelengths. A plurality of minute grooves 27 are formed around the upper face of the convex part 25a of the lens having the rectangular shape, whereby a sub-micrometer diffraction grating is formed on the on-chip micro lens 25 constituted by the optical element for sub-micrometer wavelengths. In the on-chip micro lens 25, a diameter of a planarized region 26 over the convex part 25a on which the grooves 27 are not formed is equal to or larger than that of the wavelength of the incident light, and a line width of the grooves 27 are equal to or smaller than that of the wavelength of the incident light. Also, in the on-chip micro lens 25, the grooves 27 are constituted in such a manner that the refraction index distribution becomes a Fresnel type.

Also in the solid-state imaging device 30 of the embodiment, the on-chip micro lens 25 is configured to be buried in the planarized lens layer 20, and the upper face of the planarized lens layer 20 is planarized. While in this embodiment, there is an example in which the grooves 27 constituting the on-chip micro lens 25 are formed in the upper surface of the rectangular on-chip micro lens 25, grooves 27 may be formed so as to expose the color filter layer 18, and the sub-micrometer diffraction grating may be configured in various manners.

As the materials of the on-chip micro lens 25 and the planarized lens layer 20 of this embodiment, the materials described in the first embodiment can be used. Further, the solid-state imaging device 30 of the embodiment can be formed by forming the planarized lens layer 20 after the on-chip micro lens 25 including the optical element for sub-micrometer wavelengths is formed on the color filter layer 18 by typically performed method.

In the on-chip micro lens 25 in the solid-state imaging device 30 of the embodiment, a Fresnel type refraction index distribution is achieved by the sub-micrometer diffraction grating. With the on-chip micro lens 25 configured in this manner, the incident light is collected and is incident on the light sensing portion 2.

In the on-chip micro lens 25, an arbitrary refraction index distribution can be realized by applying a modulation to a width and a position of the grating or the like, and the light collection property can be further increased by properly designing the refraction index distribution, whereby an improvement in the sensitivity is promoted.

In addition, also in the solid-state imaging device of the embodiment, the same effects as the first embodiment can be obtained.

4. Fourth Embodiment

Solid-State Imaging Device

Figure 18:
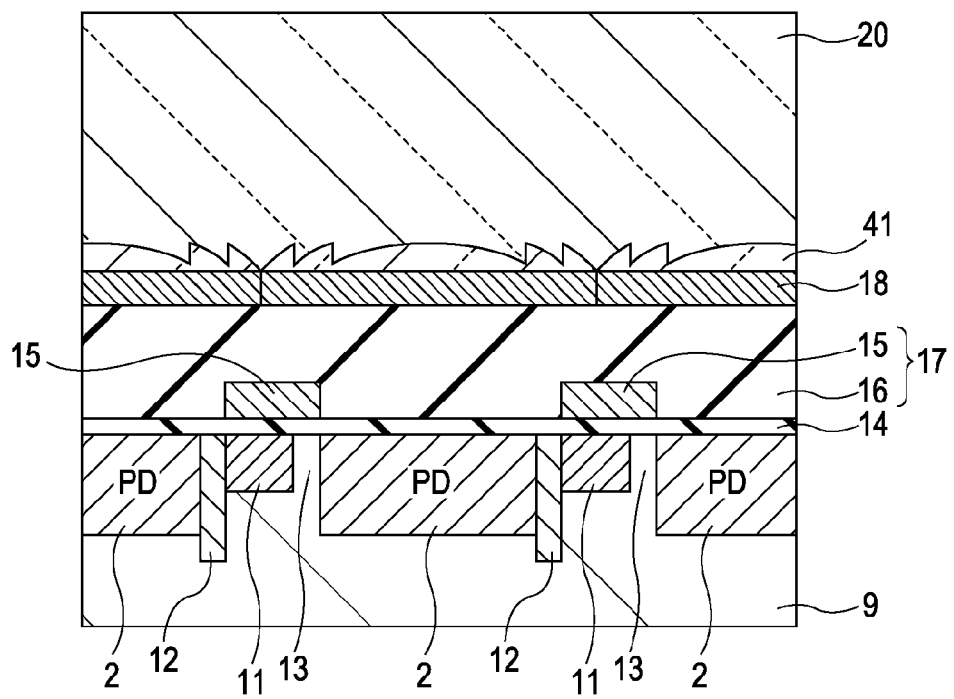
FIG. 18 is a sectional view of horizontally adjacent pixels in a solid-state imaging device according to a fourth embodiment of the invention.

Next, the solid-state imaging device of the fourth embodiment of the invention will be described. FIG. 18 is a sectional view of the horizontally adjacent pixels of the solid-state imaging device 40 of this embodiment. The overall configuration of the solid-state imaging device 40 of this embodiment is identical to those in FIG. 1, therefore the illustration thereof will be omitted. Further, the portions of FIG. 18 corresponding to those in FIG. 2 are denoted by the identical numbers and the overlapping description will be omitted.

The solid-state imaging device 40 of the embodiment is the example in which a Fresnel lens is used as the on-chip micro lens 41. Further, also in this embodiment, the on-chip micro lens 41 is covered, and the planarized lens layer 20 is formed in such a manner that its surface is planarized.

With the on-chip micro lens 41 including the Fresnel lens, the incident light is effectively collected and is incident on the light sensing portion 2.

As the materials of the on-chip micro lens 41 and the planarized lens layer 20 of the embodiment, the materials described in the first embodiment can be used. Further, the solid-state imaging device 40 of the embodiment can be formed by forming the planarized lens layer 20 after the on-chip micro lens 41 including the Fresnel lens is formed on the color filter layer 18 by the typically performed method.

Also in the solid-state imaging device 40 of the embodiment, since the planarized lens layer 20 is formed on the on-chip micro lens 41, the periodic configuration is not formed on the light incident interface which comes in contact with air, therefore the occurrence of ghost is suppressed. Also, by using the Fresnel lens as the on-chip micro lens 41, it is possible to greatly adjust the refractive power of the on-chip micro lens 41, and the light collection property is improved, whereby an improvement in the sensitivity is promoted.

While in the above-described first to fourth embodiments, CCD solid-state imaging device is exemplified, the invention is also applicable to CMOS (Complementary Metal Oxide Semiconductor) solid-state imaging device. In that case, the sensitivity and the color mixing property are also improved, and it is possible to obtain the solid-state imaging device in which the occurrence of ghost is suppressed.

Further, the invention is not limited to the application to the solid-state imaging device, and it is also applicable to the image capturing device. Here, the image capturing device refers to a camera system such as a digital still camera or a video camera, or an electronic apparatus having an image capturing function such as a cellular phone or the like. Further, there is also a case where the form of the module shape mounted on the electronic apparatus, that is to say, a camera module may be the image capturing device.

Hereinafter, the electronic apparatus which uses the solid-state imaging device of the embodiment of the invention will be described.

5. Fifth Embodiment

Electronic Apparatus

Figure 19:
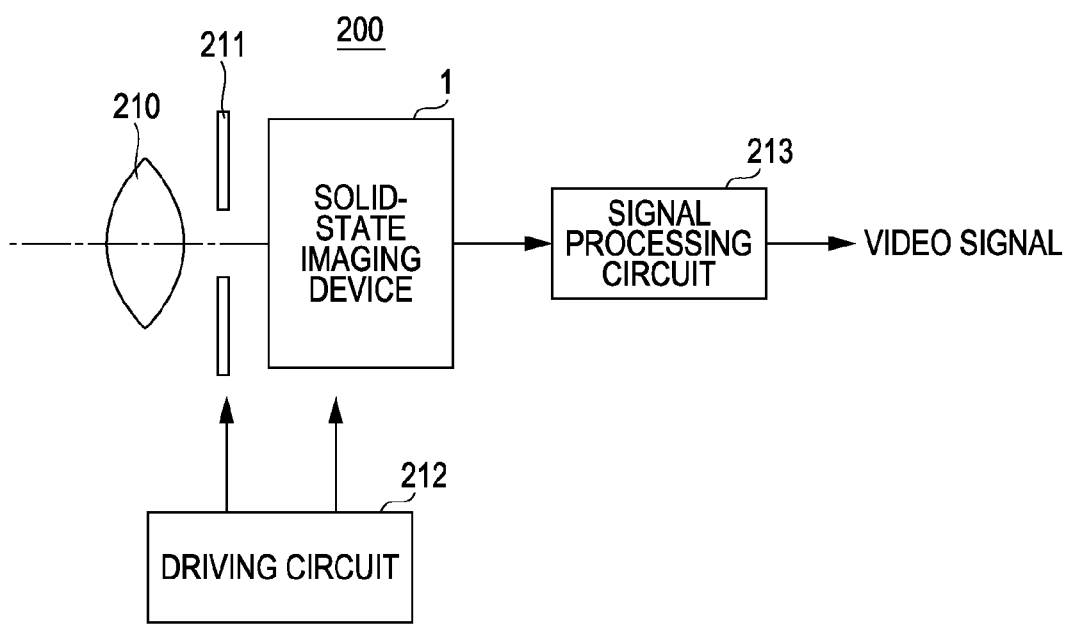
FIG. 19 is a schematic diagram of an electronic apparatus according to a fifth embodiment of the invention.

FIG. 19 is a schematic diagram of the electronic apparatus 200 according to the fifth embodiment of the present invention.

This embodiment of the electronic apparatus 200 will be described as a case where the solid-state imaging device 1 according to the above-described first embodiment is used in a camera.

FIG. 9 is a sectional view of the electronic apparatus 200 of the embodiment. The electronic apparatus 200 according to the embodiment is an exemplification of the digital still camera which is capable of photographing the still image.

The electronic apparatus 200 according to the embodiment has a solid-state imaging device 1, an optical lens 210, a drive circuit 212, and a signal processing circuit 213.

The optical lens 210 forms image of an image light (incident light) from the subject on an image capturing surface of the solid-state imaging device 1. A relevant signal electric charge is hereby accumulated in the solid-state imaging device 1 within a given period of time.

The drive circuit 212 provides a transmission operation signal of the solid-state imaging device 1. A signal transmission of the solid-state imaging device 1 is performed by the drive signal (a timing signal) provided from the drive circuit 212. The signal processing circuit 213 performs various signal processing. The video signal on which the signal processing has been performed is stored in a memory medium such as a memory or the like, or it is output to a monitor.

In the electronic apparatus 200 of the embodiment, an improvement in the sensitivity and a reduction of the color mixing are accomplished and the occurrence of ghost is suppressed in the solid-state imaging device 1, whereby an improvement in the image quality is promoted in the electronic apparatus.

The electronic apparatus to which the solid-state imaging device 1 is applicable is not limited to the digital still camera, and it is applicable to the image capturing device such as a mobile apparatus target camera module such as a cellular phone or the like.

While in the present embodiment, a configuration in which the solid-state imaging device 1 is used in the electronic apparatus has been described, it is also possible to use the solid-state imaging device of the second embodiment.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
  a plurality of pixels arranged on a substrate, each pixel of the plurality of pixels including a light sensing portion configured to generate a signal electric charge according to incident light;
  an on-chip micro lens at a light incident side above the light sensing portion, wherein the on-chip micro lens includes, in a plane that is perpendicular to a surface of the substrate, a single convex portion having a rectangular shape formed of a material that extends continuously, without gaps, over the entire light sensing portion, and a rectangular concave portion between adjacent pixels; and
  a planarized lens layer disposed on the single convex portion having the rectangular shape, wherein the planarized lens layer has a light incident surface that is planarized, wherein a refraction index of the planarized lens layer is larger than a refraction index of air and is smaller than a refraction index of the on-chip micro lens.

2. The solid-state imaging device according to claim 1, further comprising a wiring layer on a light incident side of the light sensing portion.

3. The solid-state imaging device according to claim 2, wherein a color filter is located between the wiring layer and the on-chip micro lens.

4. The solid-state imaging device according to claim 1, further including a second planarized layer, wherein the second planarized layer is buried in the concave portion and an upper face of the second planarized layer is coplanar with an upper face of the convex portion.

5. The solid-state imaging device according to claim 4, wherein the second planarized layer is disposed on both the upper face of the convex portion having a rectangular shape and the planarized layer.

6. The solid-state imaging device according to claim 4, wherein the refraction index of the planarized layer is higher than the refraction index of the second planarized layer.

7. A electronic apparatus, comprising:
  an optical lens;
  a solid-state imaging device that includes a plurality of pixels arranged on a substrate, each of the plurality of pixels including a light sensing portion configured to generate a signal electric charge according to incident light, an on-chip micro lens at a light incident side above the light sensing portion, wherein the on-chip micro lens includes, in a plane that is perpendicular to a surface of the substrate, a single convex portion having a rectangular shape formed of a material that extends continuously, without gaps, over the entire light sensing portion, and a rectangular concave portion between adjacent pixels, and a planarized lens layer disposed on the single convex portion having the rectangular shape, wherein the planarized lens layer has a light incident surface that is planarized; and
  a signal processing circuit for processing the output signal output from the solid-state imaging device, wherein a refraction index of the planarized lens layer is larger than a refraction index of air and is smaller than a refraction index of the on-chip micro lens.

8. The electronic apparatus of claim 7, further comprising a wiring layer on a light incident side of the light sensing portion.

9. The electronic apparatus of claim 8, wherein a color filter is located between the wiring layer and the on-chip micro lens.

10. The electronic apparatus of claim 7, further including a second planarized layer, wherein the second planarized layer is buried in the concave portion and an upper face of the second planarized layer is coplanar with an upper face of the convex portion.

11. The electronic apparatus of claim 10, wherein the second planarized layer is disposed on both the upper face of the convex portion having a rectangular shape and the planarized layer.

12. The electronic apparatus of claim 10, wherein the refraction index of the planarized layer is higher than the refraction index of the second planarized layer.

13. A solid-state imaging device, comprising:
  a plurality of pixels arranged on a substrate, each of the plurality of pixels including a light sensing portion configured to generate a signal electric charge according to incident light;
  an on-chip micro lens on the light incident side above the light sensing portion; and
  a planarized lens layer which covers the on-chip micro lens and has a light incident surface that is planarized, wherein:
    the on-chip micro lens includes a convex portion and a concave portion, the convex portion includes a rectangular shape formed of a material that extends over the entire light sensing portion, the on-chip micro lens is a gradient-index on-chip micro lens, the gradient-index on-chip micro lens is an optical element for sub-micrometer wavelengths, and the concave portion is between adjacent pixels.

14. The solid-state imaging device according to claim 13, further including a plurality of grooves formed around the upper face of the convex portion having the rectangular shape such that a sub-micrometer diffraction grating is provided on the on-chip micro lens.

15. The solid-state imaging device according to claim 14, wherein a width of the plurality of grooves is equal to or smaller than that of a wavelength of the incident light.

* * * * *